US009658268B2

(12) United States Patent
Schmauss

(10) Patent No.: US 9,658,268 B2
(45) Date of Patent: May 23, 2017

(54) DEVICE FOR DIAGNOSING A CIRCUIT ARRANGEMENT

(71) Applicant: CONTINENTAL AUTOMOTIVE GMBH, Hannover (DE)

(72) Inventor: Harald Schmauss, Donaustauf (DE)

(73) Assignee: Continental Automotive GmbH, Hannover (DE)

(*) Notice: Subject to any disclaimer, the term of this patent is extended or adjusted under 35 U.S.C. 154(b) by 65 days.

(21) Appl. No.: 14/413,609

(22) PCT Filed: Jul. 2, 2013

(86) PCT No.: PCT/EP2013/063952
§ 371 (c)(1),
(2) Date: Jan. 8, 2015

(87) PCT Pub. No.: WO2014/009207
PCT Pub. Date: Jan. 16, 2014

(65) Prior Publication Data
US 2015/0137828 A1 May 21, 2015

(30) Foreign Application Priority Data

Jul. 11, 2012 (DE) .................. 10 2012 212 123

(51) Int. Cl.
G01R 31/14 (2006.01)
G01R 31/02 (2006.01)
(52) U.S. Cl.
CPC ......... G01R 31/025 (2013.01); G01R 31/026 (2013.01)

(58) Field of Classification Search
CPC ............................ G01R 31/025; G01R 31/026
USPC ......................................... 324/511, 537, 551
See application file for complete search history.

(56) References Cited

U.S. PATENT DOCUMENTS

| 5,909,348 A | 6/1999 | Zydek et al. |
| 7,250,872 B2 | 7/2007 | Klinger |
| 7,777,565 B2 | 8/2010 | Tanizawa |
| 7,986,149 B2 | 7/2011 | Covalenco et al. |

(Continued)

FOREIGN PATENT DOCUMENTS

| CN | 101523835 A | 9/2009 |
| DE | 19526435 A1 | 12/1996 |

(Continued)

Primary Examiner — Farhana Hoque
(74) Attorney, Agent, or Firm — Laurence A. Greenberg; Werner H. Stemer; Ralph E. Locher

(57) ABSTRACT

An apparatus for diagnosing a circuit arrangement for a short circuit and/or a line interruption. The circuit arrangement has at least two load circuits which are connected in parallel. A current measuring device for providing a current signal, which represents the current in the common supply line, is connected in a common supply line to the at least two parallel-connected load circuits. A voltage measuring device detect a node point voltage of each load circuit in the two switching states of the respective switching element. An evaluation device receives the current signal and the node point voltages, converts the current signal into at least one logic current value and the node point voltages into logic voltage values, and infers the type and location of the fault on the basis of prespecified combinations of the at least one logic current value and the logic voltage values.

13 Claims, 3 Drawing Sheets

(56) References Cited

U.S. PATENT DOCUMENTS

| | | | |
|---|---|---|---|
| 8,294,474 B2 | 10/2012 | Ahrens et al. | |
| 8,860,428 B2 | 10/2014 | Garneyer et al. | |
| 2010/0033884 A1* | 2/2010 | Fan | H02H 9/046 361/56 |
| 2011/0031978 A1* | 2/2011 | Garneyer | H02H 7/0838 324/537 |
| 2011/0181293 A1* | 7/2011 | Fichtlscherer | G01R 31/40 324/537 |

FOREIGN PATENT DOCUMENTS

| | | |
|---|---|---|
| DE | 102004027676 A1 | 11/2005 |
| DE | 102004056868 A1 | 6/2006 |
| DE | 102008037405 A1 | 4/2009 |
| DE | 102009028665 A1 | 3/2010 |
| WO | 2009124884 A1 | 10/2009 |

\* cited by examiner

DEVICE FOR DIAGNOSING A CIRCUIT ARRANGEMENT

BACKGROUND OF THE INVENTION

Field of the Invention

The invention relates to a device for diagnosing a short circuit and/or a line interruption in a circuit arrangement. In particular, the diagnosis comprises ascertaining short circuits from a reference potential and from a supply potential. The diagnosed circuit arrangement comprises at least two load circuits interconnected in parallel.

Such a diagnostic device is used, for example, to check the electrification of ignition coils or injection valves in motor vehicles. Ignition coils or injection valves, in general: loads, are connected to a common voltage supply in this exemplary embodiment. They are switched on and off by selective switching elements which are generally arranged in a controller, as a result of which switching-on and -off circuits are closed and opened by the generation of ground connections. If the switching elements are arranged between the load and the ground connection, these are referred to as low-side switching elements.

In the case of the diagnosis of the described case of application, the problem consists in that, by virtue of the current or voltage measurement present in each load path, a line diagnosis cannot differentiate between a short circuit to reference potential and an open line. The differentiation of these cases thus requires an additional analog diagnostic circuit in addition to a current measuring resistor.

The so-called elimination method is used as a typical procedure for identifying a line fault. A current measurement is generally performed by means of a measuring resistor (so-called shunt) which is provided in a respective load path between the semiconductor switching element and the reference potential connection. If, in the event of a switching element being switched on, the expected load current flows through the measuring resistor, a short circuit to reference potential and an open connection of the line between the load and the switching element can be eliminated. If the expected load current is not flowing, either the short circuit to reference potential or an open line are present. Differentiation between these two fault cases is not possible with the current information alone.

Therefore, in order to differentiate between a short circuit to reference potential and an open line, a diagnostic source is usually connected at the node between the load and the associated switching element, the diagnostic current of which source is significantly lower than the nominal load current. The diagnostic source can optionally be designed as voltage or current source. In order to be able to identify a fault in the diagnostic voltage in the event of a short circuit to supply voltage, said diagnostic voltage is usually lower than the supply voltage.

In the event of an open line, the voltage at the node between the load and the switching element would set itself to the value of the diagnostic voltage. In the event of a short circuit to reference potential, the voltage at said node would decrease to a value close to the reference potential. By combination of the information of the current and voltage measurements, it is possible thus to differentiate between short circuits to reference potential and open lines at the switching element of the load path.

The evaluation of the diagnosis is thus based exclusively on measured values which were ascertained at the load path to be diagnosed. As a result, great expenditure is to be involved for the diagnostic device. The problem addressed by the present invention is to specify a device for diagnosing a circuit arrangement, which device enables reliable differentiation between different fault cases with simplified circuit expenditure.

This problem is solved by a device according to the features as claimed. Advantageous configurations emerge from the dependent patent claims.

BRIEF SUMMARY OF THE INVENTION

The invention achieves a device for diagnosing a short circuit and/or a line interruption in a circuit arrangement. In particular, the diagnosis comprises ascertaining short circuits to reference potential and to supply potential. The circuit arrangement comprises at least two load circuits interconnected in parallel. The diagnostic device comprises a current measuring device and a voltage measuring device.

In the case of the device according to the invention, the current measuring device is interconnected in a common supply line of the at least two load circuits connected in parallel, said current measuring device being for the purpose of providing a current signal representing the current in the common supply line. In this connection, the common supply line is to be understood as meaning a common supply line with respect to the load circuits connected in parallel.

The voltage measuring device of the diagnostic device is provided for detecting and providing a node voltage of each load circuit in the two switching states of the respective switching element.

Furthermore, an evaluation device is provided, to which the current signal and the node voltages can be supplied, wherein the control device is designed to convert the current signal into at least one logical current value and the node voltages into logical voltage values and, on the basis of predefined combinations of the at least one logical current value and the logical voltage values, to conclude the type and location of the fault.

The diagnostic device according to the invention makes it possible to differentiate between the abovementioned fault cases with a reduced number of measuring means. Firstly, this is enabled by virtue of a single current measuring device which is arranged not in the respective load paths, unlike in the prior art, but in the common supply line. Accordingly, the diagnostic devices associated with a respective current measuring device from the prior art are also omitted.

The differentiation of fault cases and fault-free cases (good cases) is done by a combination of voltage information of a plurality of load paths in the two switching states of the respective switching elements. Owing to the fact that the logical linking of respective current and voltage values is done, the measuring means used to acquire the current and voltages do not need to be particularly precise, either. The device according to the invention makes it possible by virtue of its constructional configuration to ascertain statements in respect of current and voltage values by means of comparator circuits. Expensive, precise analog measurements are not necessary.

In a configuration of the device according to the invention, the parallel circuit composed of the at least two load circuits is interconnected between a first supply potential connection and a reference potential connection. This configuration results from the circumstance that, contrary to the known procedure, the current measuring device is not provided in a respective load circuit between the switching element and the reference potential connection. Instead, said current measuring device is provided on the "high side" in the common supply line. In particular, the current measuring device is interconnected between the first supply potential connection and a second supply potential connection, which has a supply voltage applied thereto.

According to another configuration, each load circuit is formed from the series connection composed of a load and a controllable switching element. The load can be, for example, provided the diagnostic device is used in the setting of a motor vehicle, ignition coils or injection valves. However, the use of the diagnostic device according to the invention is not restricted to this application case, with the result that the loads could also be formed by other components. A semiconductor switching element is preferably used as controllable switching element. In the mentioned setting of the motor vehicle application, an IGBT (insulated-gate bipolar transistor) or a MOSFET is usually used. In this connection, the controllable switching element can be interconnected between the load and the reference potential connection. Such an interconnection is known as low-side configuration.

In another expedient configuration, the current measuring device comprises a measuring element and a difference amplifier, wherein a voltage dropping across the measuring element can be supplied to the difference amplifier in order to generate from said signal the current signal which can be supplied to the evaluation device. The measuring element can optionally be designed as a current measuring resistor or as a controllable switching element, in particular semiconductor switching element. In a manner known to a person skilled in the art, in the case of a controllable semiconductor switching element, use is made of the circumstance that, in the case of a semiconductor switching element connected so as to be conducting, a voltage which is proportional to the flow of current can be tapped across the load route owing to an unavoidable resistance.

According to another expedient configuration, the evaluation device comprises a current evaluation unit, which is designed to compare the current signal with a first threshold value and a second threshold value, wherein a comparison result with the first threshold value represents a first logical current value and a comparison result with the second threshold value represents a second logical current value. In this configuration, the current evaluation unit can preferably be designed as a window comparator. The current evaluation unit performs a comparison of the current detected by the measuring element of the current measuring device, with the result that, on the basis of the logical current values, the statements "no current (much less than a nominal load current) is flowing", "approximately the nominal load current is flowing", "much more current than the nominal load current is flowing" can be made.

In connection with a voltage evaluation unit—described in more detail below—of the evaluation device which likewise provides binary information with respect to "the voltage corresponds approximately to the supply voltage" and "the voltage is substantially lower than the supply voltage", the above described fault cases can be easily ascertained without expensive analog measurements. The voltage evaluation unit provided in a preferred configuration is designed to compare a node voltage with a first threshold value and a second threshold value, wherein a comparison result with a first threshold value represents a first logical voltage value and a comparison result with a second threshold value represents a second logical voltage value.

In the case of the voltage evaluation unit provided according to the invention, this can also comprise a window comparator, as a result of which the comparison using minimum means can be made possible.

It is also expedient if a respective node voltage can be supplied via a multiplexer to the window comparator of the voltage evaluation unit, with the result that the statements with respect to the voltage can be found separately for each load circuit. In this case, the voltage information ascertained for each load circuit can also be linked in order to obtain a complete state description of the diagnosed circuit arrangement.

BRIEF DESCRIPTION OF THE SEVERAL VIEWS OF THE DRAWING

The invention is explained in more detail below with reference to an exemplary embodiment in the drawing, in which.

DESCRIPTION OF THE INVENTION

Figure 1:
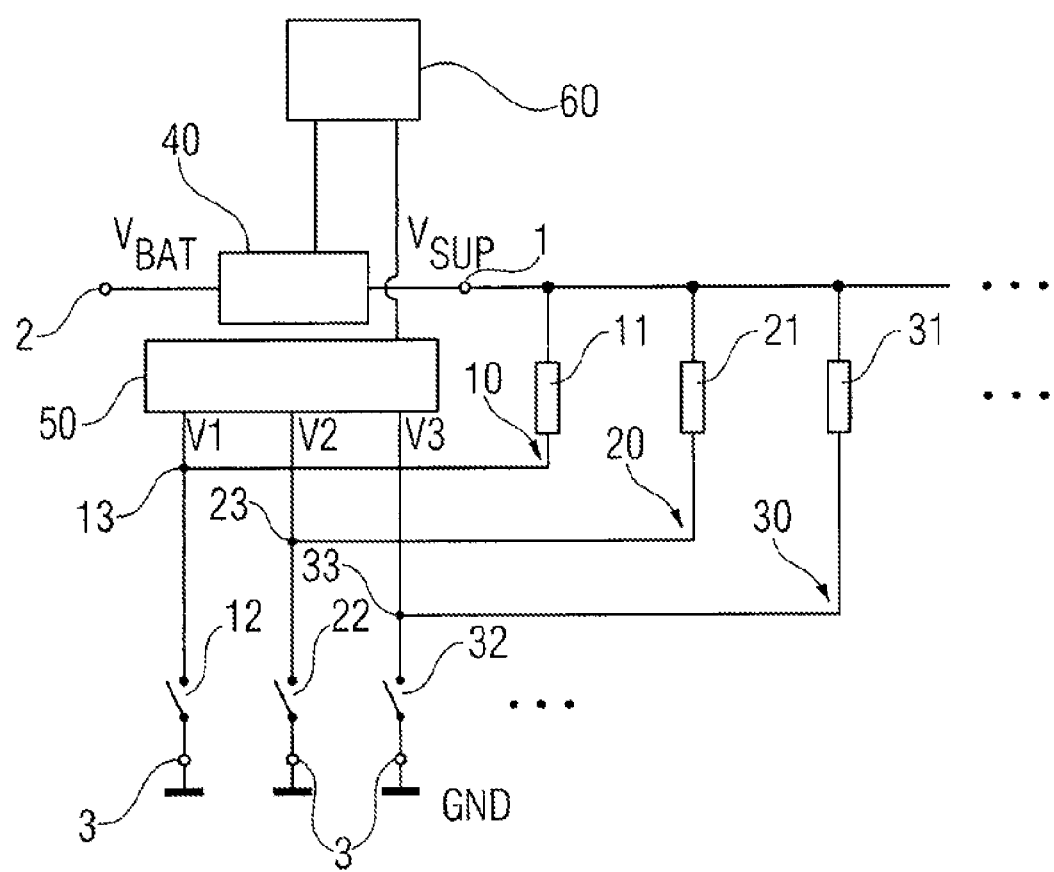
FIG. 1 shows a schematic illustration of a device according to the invention for diagnosing a short circuit and/or a line interruption in a circuit arrangement

FIG. 1 shows a device according to the invention for diagnosing a short circuit and/or a line interruption in a circuit arrangement. In particular, the device is suitable for ascertaining short circuits to reference potential and to supply potential. In particular, in this case, the abovementioned faults can be differentiated.

The circuit arrangement to be diagnosed comprises, in general, at least two load circuits connected in parallel. In the present exemplary embodiment, three load circuits 10, 20, 30 connected in parallel are illustrated by way of example. Each of the load circuits 10, 20, 30 is formed from the series connection of a load 11, 21, 31 and a controllable switching element 12, 22, 32. The loads 11, 21, 31 may be, for example, ignition coils or injection valves of a motor vehicle.

The load circuits 10, 20, 30 are interconnected between a first supply potential connection 1 and a reference potential connection 3. In this case, the controllable switching elements 12, 22, 32 of a respective load circuit 10, 20, 30 are located between the associated load 11, 21, 31 and the reference potential connection 3. Such a circuit configuration, in which the switching elements are coupled to the reference potential connection, is referred to as low-side configuration. The reference potential connections 3, which are illustrated as electrically isolated in FIG. 1, may be in contact with a common ground potential GND, in practice.

A current measuring device 40 is interconnected in a common supply line between the first supply potential connection 1 and a second supply potential connection 2 with reference to the load circuits 10, 20, 30 connected in parallel, to provide a current signal representing the current in the common supply line. A voltage $V_{BAT}$ is present at the second supply potential connection 2. A voltage $V_{SUP}$ which is reduced by the voltage dropping in the current measuring device 40 is present at the first supply potential connection.

A voltage measuring device 50 is used to acquire and provide a respective node voltage V1, V2, V3 of each load circuit 10, 20, 30 in the two switching states (switched on or conducting and switched off or blocking) of the respective switching element 12, 22, 32. The voltage measuring device 50 is therefore connected to nodes 13, 23, 33 of the respective load circuits 10, 20, 30.

The current signal and the node voltages V1, V2, V3 can be supplied to an evaluation device 60. The evaluation device 60 can be designed to convert the current signal $V_{HS\_CUR}$ into at least one logical current value OC_HS or UC_HS. Furthermore, the evaluation device 60 is designed to convert the node voltages V1, V2, V3 into logical voltage values LS_High or LS_Low. On the basis of predefined combinations of the logical current value or values OC_HS, UC_HS and the logical voltage values LS_High, LS_Low, it is possible to conclude the type and location of a fault. A fault in this case is a short circuit to reference potential GND and to supply potential $V_{SUP}$ or $V_{BAT}$ or a line interruption. The line interruption in this case can be detected between the loads 11, 21, 31 and the nodes 13, 23, 33 or between the loads 11, 21, 31 and the current measuring device or the first supply potential connection 1. Line interruptions in other lines are not monitored or detected. This results from the fact that, for example in the context of a motor vehicle application, the current measuring device 40, the voltage measuring device 50, the evaluation device 60 and the controllable switching elements 12, 22, 32 are arranged in a common controller. The loads 11, 21, 31 are in this case connected to the controller via a cable loom. Here, the cable loom comprises a connection to the first supply potential connection 1 and to the nodes 13, 23, 33. With reference to the components arranged in the controller, it is assumed here that no faults are present since only fault-free controllers are used. In contrast, the device proposed according to the invention for diagnosing the circuit arrangement during running operation, for example of a motor vehicle, is used in order regularly to check faults in the cabling during operation of the motor vehicle.

Figure 2:
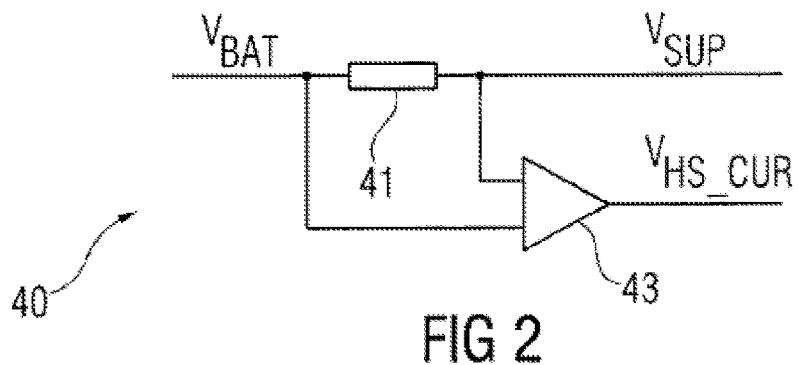
FIG. 2 shows a first variant of a current measuring device used in a device according to the invention.
Figure 3:
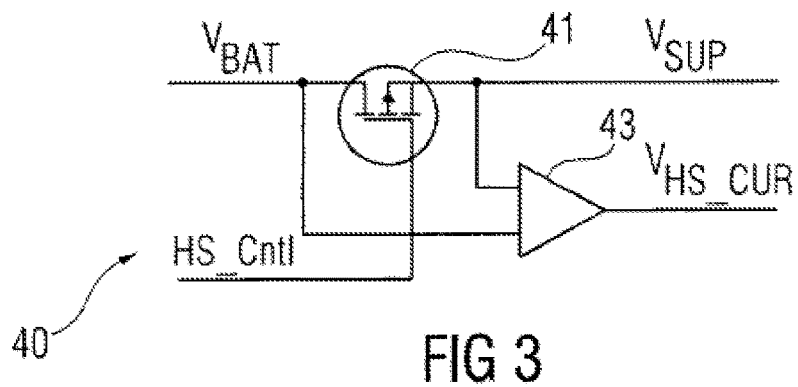
FIG. 3 shows a second variant of a current measuring device used in a device according to the invention.
Figure 4:
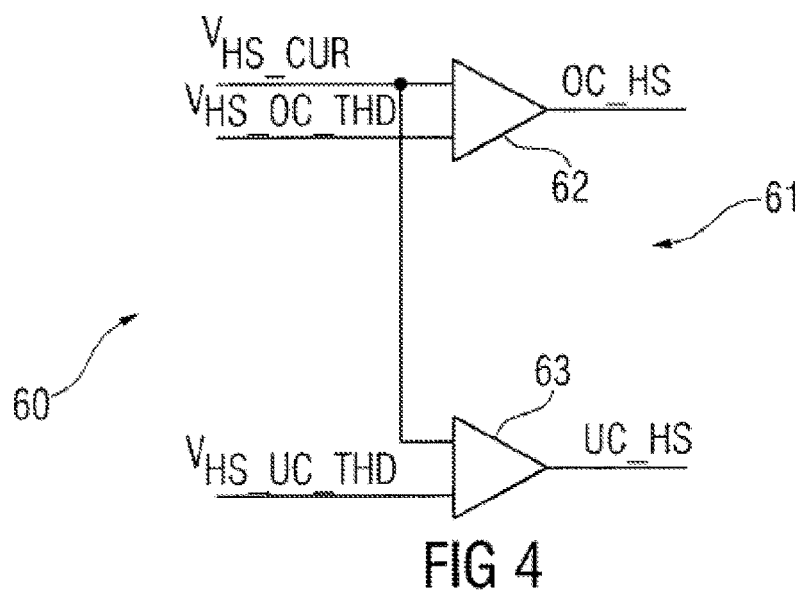
FIG. 4 shows an exemplary evaluation device for evaluating the current signal acquired from the current measuring device.

FIGS. 2 and 3 show alternative configurations of a current measuring device 40 from FIG. 1. The current measuring device 40 comprises a measuring element 41, wherein a voltage dropping across the measuring element 41 can be supplied to a difference amplifier 43. The current signal $V_{HS\_CUR}$ which is supplied to the evaluation device 60 is generated from the voltage dropping across the measuring element 41. The measuring element 41 can selectively be designed as current measuring resistor (shunt) or as controllable semiconductor switching element, for example a MOSFET. A current measuring device with a current measuring resistor is illustrated in FIG. 2; a current measuring device with a MOSFET is illustrated in FIG. 3. In order to be driven, a control signal HS_Cntl is applied to the gate connection of the MOSFET. In a manner known to a person skilled in the art, a voltage drop occurs, even when a MOSFET is switched on, via the drain-source route thereof, which voltage drop is detected and amplified by the difference amplifier. FIG. 4 shows a current evaluation unit 61 of the evaluation device 60 from FIG. 1. The current evaluation unit 61 comprises a first and second comparator 62, 63 which are interconnected as or can be designed as window comparator. The current signal $V_{HS\_CUR}$ is supplied to a respective first input of the comparators 62, 63. Threshold value signals are supplied to the respective other inputs of the comparators 62, 63. A first threshold value $V_{HS\_OC\_THD}$, which is supplied to the comparator 62 at its second input, has a threshold value which is greater than a nominal current of the circuit arrangement from FIG. 1 when operating as intended. The second threshold value $V_{HS\_UC\_THD}$, which is supplied to the second input of the comparator 63, represents a threshold value which is lower than the nominal current through the circuit arrangement from FIG. 1. As a result of this, the first logical current value OC_HS of the comparator 62 activates and outputs a second signal if the current flowing through the circuit arrangement or the current measuring device 41 is greater than the nominal current. Accordingly, the second logical current value UC_HS activates if the current flowing through the current measuring device 40 is lower than the nominal current. The logical current values OC_HS and UC_HS may be represented in binary fashion by logic "1" or logic "0". A logic "1" corresponds, for example, to a positive comparison, that is to say in the case of the comparator 62, the current signal $V_{HS\_CUR}$ is greater than the threshold value $V_{HS\_OC\_THD}$ or, in the case of the comparator 63, the current signal $V_{HS\_CUR}$ is lower than the threshold value $V_{HS\_UC\_THD}$.

Figure 5:
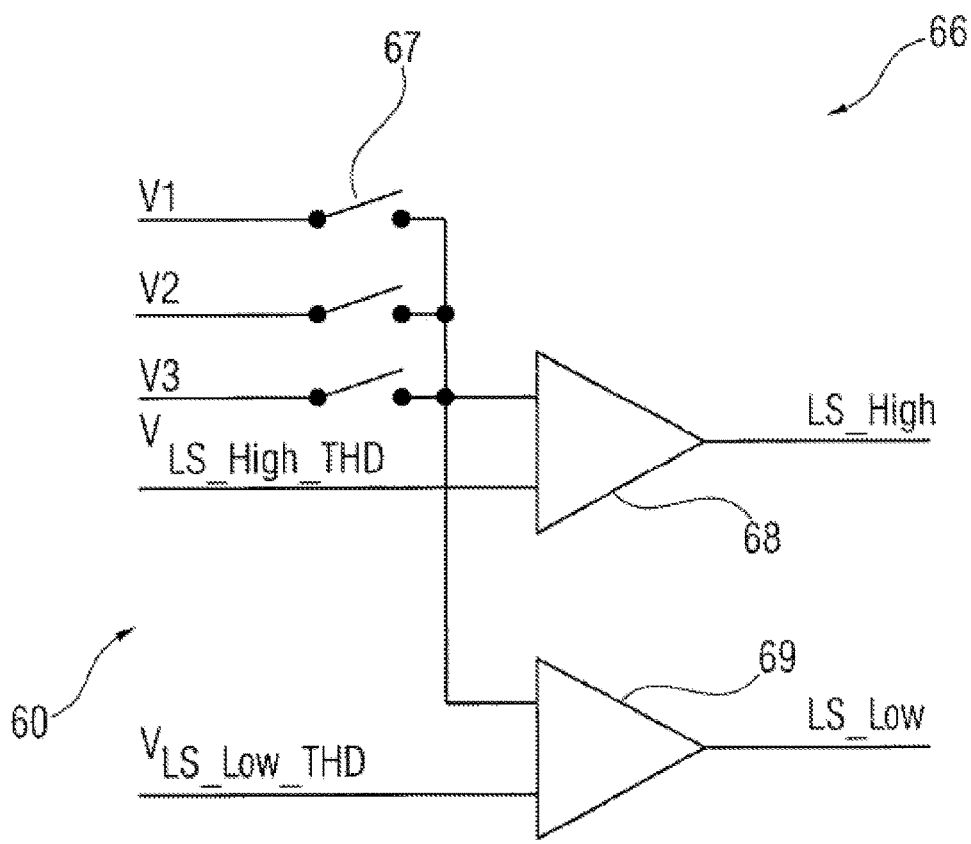
FIG. 5 shows a voltage evaluation unit of the evaluation device provided in the device according to the invention.

FIG. 5 shows a voltage evaluation unit 66 of the evaluation device 60. Said voltage evaluation unit 66 likewise comprises two comparators 68, 69 which are again interconnected as a window comparator. A respective first input of the comparators 68, 69 can selectively have one of the node voltages V1, V2, V3 applied thereto via a multiplexer 67 or controllable switches 67. A comparison follows in the first comparator 68 with a first threshold value $V_{LS\_High\_THD}$ and in the second comparator 69 with a second threshold value $V_{LS\_Low\_THD}$. At the output of the comparator 68, a first logical voltage value LS_High is available and at the output of the second comparator, a second logical voltage value LS_Low is available. These values can again be represented as logic "1" and logic "0". A logic "1" is present, for example, at an output of the comparator 68 or 69 if the comparison of the node voltage V1, V2 or V3 connected to the first input with the respective first or second threshold value is positive. In the other case, a logic "0" is present at the output of the comparator 68, 69 in question.

Instead of the window comparator shown in FIG. 5, a simple comparator could also be used, which enables a comparison with a single threshold. In this case, the outputs of the comparators 68, 69 from FIG. 5 are then replaced by a single output. A logic "0" at the output then corresponds to LS_Low="1" and LS_High="0". A logic "1" at the output corresponds to LS_Low="0" and LS_High="1".

The differentiation between good cases and fault cases (short circuit and/or line interruption of the type mentioned above) is done by a combination of diagnostic information which is compiled from at least one logical current value OC_HS and/or UC_HS and the logical voltage values LS_High and LS_Low. In this case, the corresponding logical current values are selectively ascertained with reference to a switching element which is switched on and off of the load path in question.

The different fault cases and good cases which may occur in the circuit arrangement are explained in more detail below.

Case 1 (SCB_HS): identifying a short circuit in the common connection line to $V_{BAT}$. A short circuit in the common supply line, that is to say the line in which the first supply potential connection 1 lies, to $V_{BAT}$ (that is to say, to the first supply potential connection) can be identified if at least one of the switching elements 12, 22, 32 is switched on but no flow of current through the current measuring device 40 is detected. A further condition is that, when the semiconductor switching elements are switched off, the node voltages are at the level of $V_{BAT}$. In order to obtain a complete overall picture, all states (ON/OFF) of the switching elements 12, 22, 32 must be driven once.

Consequently, the following identity matrix results:

| State | 1. | LS1 | ON | OFF | OFF | OFF |
|---|---|---|---|---|---|---|
| | 2. | LS2 | ON | OFF | OFF | OFF |
| | 3. | LS3 | ON | OFF | OFF | OFF |
| Symptoms | | | UC_HS | LS_High_10 | LS_High_20 | LS_High_30 |
| Diag | | SCB_HS | 1 | 1 | 1 | 1 |

In this and in the subsequent tables, the term "State" refers to the state of the switching element or elements LS1, LS2, LS3, wherein LS1 corresponds to the switching element 12 in the load circuit 10, LS2 corresponds to the switching element 22 in the load circuit 20 and LS3 corresponds to the switching element 32 in the load circuit 30. 1., 2. and 3. refer to a selective consideration of the switching elements. "ON" represents a switching element which is switched on or conducting. "OFF" represents a switching element which is switched off or blocking. If an "X" is contained in the matrix of the states of the switching elements, the switching state of the switching element is arbitrary, that is to say the switching element can selectively be switched on or off. "Symptoms" denotes the logical current or voltage values taken into account for the fault case in question. The index "_10", "_20" or "_30" here denotes the load circuit in question. "Diag" then denotes the "necessary" current and/or voltage values for a particular fault case (see Symptoms).

Case 2 (SCB_LS_x, wherein x=10, 20 or 30): identifying a short circuit or a low-impedance connection of the load 11, 21, 31 to the node 13, 23, 33. This fault case is checked separately for each load circuit 10, 20, 30. If it is identified, for example when the load circuit 10 is checked with the switching element 12 switched on, that the voltage drop across the switched-on switching element 12 exceeds a maximum value, this is made known at the comparator 68 with a logic "1". At the same time as the checking of the load circuit 10, the switching elements 22, 32 of the remaining load circuits 20, 30 are switched off. The other load circuits are checked in a corresponding manner.

| State | LS1 | ON | OFF | OFF |
|---|---|---|---|---|
| | LS2 | OFF | ON | OFF |
| | LS3 | OFF | OFF | ON |
| Symptoms | | LS_high_10 | LS_high_20 | LS_high_30 |
| Diag | SCB_LS_10 | 1 | 0 | 0 |
| | SCB_LS_20 | 0 | 1 | 0 |
| | SCB_LS_30 | 0 | 0 | 1 |

Case 3 (SCG_HS): identifying a short circuit or a low-impedance connection of the supply line, at which the supply voltage $V_{SUP}$ is present, to ground potential GND. This fault case is identified if the current through the current measuring device 40 in the common supply line exceeds a maximum value. This fault case is identified at any time, independently of whether or not one or more switching elements 12, 22, 32 are switched on. The fact that the flow of current has exceeded the maximum value is made known in the case of the first logical current value OC_HS with a logic "1".

| State | LS1 | X |
|---|---|---|
| | LS2 | X |
| | LS3 | X |

| Symptoms | | SCG_HS | OC_HS |
|---|---|---|---|
| Diag | | SCG_HS | 1 |

Case 4 (SCG_LS_x, wherein x=10, 20 or 30): a short circuit in the load circuit to ground potential GND is identified if the associated switching element 12, 22 or 32 in the faulty load circuit 10, 20 or 30 is switched off but the voltage at the node 13, 23, 33 is not at the voltage level of the first supply potential connection, that is to say $V_{SUP}$. This is made known in a logic "1" of the second logical voltage value LS_Low of the load path in question. It is insignificant for this check what state the switching elements of the load paths which are not currently being checked are in. A further condition is that the current through the current measuring device 40 is not zero when all of the switching elements 12, 22, 32 are switched off. This means the second logical current value must be logic "1" since the current flowing through the current measuring device is greater than the second threshold value $V_{HS\_UC\_THD}$. The three possible case constellations are illustrated in the table. A short circuit in the load circuit to reference potential therefore necessitates a logic "0" in the case of the second logical current value UC_HS and a logic "1" in the case of the second logical voltage value LS_Low x.

| State | 1. | LS1 | OFF | OFF | X | X |
|---|---|---|---|---|---|---|
| | 2. | LS2 | OFF | X | OFF | X |
| | 3. | LS3 | OFF | X | X | OFF |
| Symptoms | | | UC_HS | LS_Low_10 | LS_Low_20 | LS_Low_30 |
| Diag | 1. | SCG_LS_10 | 0 | 1 | X | X |
| | 2. | SCG_LS_20 | 0 | X | 1 | X |
| | 3. | SCG_LS_30 | 0 | X | X | 1 |

Case 5 (OL_HS): an interruption of the common supply line to the loads 11, 21, 31 is identified if all of the switching elements 12, 22, 32 are switched off, all of the voltages at the nodes 13, 23, 33 are approximately 0 V. This results in the second logical voltage value LS_Low_10 or LS_Low_20 or LS_Low_30 corresponding to a logic "1". In addition, all of the switching elements 12, 22, 32 can (optionally) be switched on and off again in sequence, wherein no flow of current was diagnosed in the common supply line by the current measuring device 40. This is made known in the case of the second logical current value UC_HS with a logic "1". The switching-on and -off again is illustrated in the table below, wherein the switching element of the checked load path is switched off ("OFF") in the first column of the right-hand side and in the subsequent columns is switched on ("ON") for the checked load path.

| State | 1. | LS1 | OFF | OFF | OFF | OFF | ON | OFF | OFF |
|---|---|---|---|---|---|---|---|---|---|
| | 2. | LS2 | OFF | OFF | OFF | OFF | OFF | ON | OFF |
| | 3. | LS3 | OFF | OFF | OFF | OFF | OFF | OFF | ON |

-continued

| Symptoms | | LS_Low_10 | LS_Low_20 | LS_Low_30 | UC_HS | UC_HS | UC_HS | UC_HS |
|---|---|---|---|---|---|---|---|---|
| Diag | OL_HS | 1 | 1 | 1 | 1 | 1 | 1 | 1 |

Case 6: a line interruption in a load path of a load circuit 10, 20, 30 is identified if the associated switching element 12, 22, 32 is switched off but the node voltage V1, V2 and V3 at the associated node 13, 23, 33 is not at the level of the first supply potential connection 1, that is to say $V_{SUP}$. A further condition is that no current flows in the common supply line when the associated switching element is switched on. For the load path of the load circuit 10 (left-hand column of the table), this means that when the switching element 12 (LS1 in the table) is switched off, the second logical voltage value LS_Low_10 is a logic "1". When the switching element 12 is switched on, the second logical current value UC_HS is a logic "1".

In the event that it is to be determined whether or not the line interruption is present in the common supply line or in the load path of the load circuit, it must additionally be checked whether or not a current flows through one of the two other switching elements 22 (LS2) or 32 (LS3). If a logic "0" emerges here for the second logical current value UC_HS, there is a line interruption in the load path of the load circuit 10. If, however, the result for the two other load paths is likewise a logic "1", the line interruption is between the node of the three load circuits and the first supply potential connection

| State | LS1 | OFF | ON | X | X | X | X | ON | X | X | X | ON | X |
| | LS2 | X | X | ON | X | OFF | ON | X | X | X | X | X | ON |
| | LS3 | X | X | X | ON | X | X | X. | ON | OFF | ON | X | X |
| Symptoms | | LS_Low_10 | UC_HS | UC_HS | UC_HS | LS_Low_20 | UC_HS | UC_HS | UC_HS | LS_Low_30 | UC_HS | UC_HS | UC_HS |
| Diag | OL_LS_10 | 1 | 1 | | | | | 0 | | | | 0 | |
| | OL_LS_20 | | | 0 | | 1 | 1 | | | | | | 0 |
| | OL_LS_30 | | | | 0 | | | | 0 | 1 | 1 | | |

Case 7: the fault-free state is identified if the voltages at the connection lines between the loads 11, 21, 31 and the associated switching elements 12, 22, 32 are at the level of the voltage $V_{SUP}$ when the respective switching elements 12, 22, 32 are switched off and no current has been detected in the common supply line by the current measuring device. A further condition is that, when a switching element is switched on, approximately the expected load current must flow in the common supply line. This is illustrated in the following table.

The advantage of the described device consists in that only one single current measuring device is required, which current measuring device is arranged in the common supply line of the load circuits. Furthermore, no additional diagnostic devices, such as current measuring resistors or diagnostic sources, are required. The differentiation between good and fault cases is done by the combination of the current and voltage information of a plurality of load circuits in the two switching states of the respective switching elements. A further advantage of the invention is that neither the current measurement in the common supply line nor the voltage measurements need to be particularly precise. The statements relating to current and voltage values are ascertained by means of comparator circuits, as a result of which elaborate analog measurements are omitted.

The invention claimed is:

1. A device for diagnosing a fault in a circuit arrangement, the circuit arrangement having at least two load circuits connected in parallel with one another to a common supply line, the device comprising:
   a current measuring device connected in the common supply line of the at least two load circuits and configured for providing a current signal representing a current in the common supply line;
   a voltage measuring device for detecting and providing a node voltage of each load circuit in two switching states of a respective switching element thereof; and
   an evaluation device disposed to receive the current signal and the node voltages, said evaluation device being configured to convert the current signal into at least one logic current value and to convert the node voltages into logic voltage values, and, based on predefined combinations of the at least one logic current value and the logic voltage values, to conclude a type and a location of the fault.

2. The device according to claim 1, wherein the fault to be detected is a short circuit and/or a line interruption in the circuit arrangement.

3. The device according to claim 1, wherein the parallel circuit composed of the at least two load circuits is con-

| State | LS1 | OFF | OFF | ON | ON | X | X | OFF | OFF | X | X | OFF | OFF |
| | LS2 | X | X | OFF | OFF | OFF | OFF | ON | ON | X | X | OFF | OFF |
| | LS3 | X | X | OFF | OFF | X | X | OFF | OFF | OFF | OFF | ON | ON |
| Symptoms | | LS_high_10 | UC_LS_10 | UC_HS | OC_HS | LS_high_20 | UC_LS_20 | UC_HS | OC_HS | LS_high_30 | UC_LS_30 | UC_HS | OC_HS |
| Diag | No_Fail_10 | 1 | 1 | 0 | 0 | | | | | | | | |
| | No_Fail_20 | | | | | 1 | 1 | 0 | 0 | | | | |
| | No_Fail_30 | | | | | | | | | 1 | 1 | 0 | 0 | nected between a first supply potential connection and a reference potential connection.

4. The device according to claim 3, wherein each load circuit comprises a series connection of a load and a controllable switching element.

5. The device according to claim 4, wherein the controllable switching element is connected between the load and the reference potential connection.

6. The device according to claim 1, wherein said current measuring device is connected between a first supply potential connection and a second supply potential connection carrying a supply voltage.

7. The device according to claim 1, wherein said current measuring device comprises a measuring element and a difference amplifier connected to receive a voltage signal representing a voltage dropping across said measuring element, and wherein said difference amplifier generates from the voltage signal the current signal to be supplied to said evaluation device.

8. The device according to claim 7, wherein said measuring element is a current measuring resistor or a controllable semiconductor switching element.

9. The device according to claim 1, wherein said evaluation device comprises a current evaluation unit configured to compare the current signal with a first threshold value and a second threshold value, wherein a comparison result with the first threshold value represents a first logic current value and a comparison result with the second threshold value represents a second logic current value.

10. The device according to claim 9, wherein said current evaluation unit is a window comparator.

11. The device according to claim 1, wherein said evaluation device comprises a voltage evaluation unit configured to compare a node voltage with a first threshold value and a second threshold value, wherein a comparison result with the first threshold value represents a first logic voltage value and a comparison result with the second threshold value represents a second logic voltage value.

12. The device according to claim 11, wherein said voltage evaluation unit comprises a window comparator.

13. The device according to claim 12, which comprises a multiplexer connected to supply the respective node voltages to said window comparator.

* * * * *